(12) United States Patent
Zhang et al.

(10) Patent No.: US 7,278,076 B2
(45) Date of Patent: *Oct. 2, 2007

(54) SYSTEM AND SCANOUT CIRCUITS WITH ERROR RESILIENCE CIRCUIT

(75) Inventors: Ming Zhang, Urbana, IL (US);
Subhasish Mitra, Folsom, CA (US);
Tak M. Mak, Union City, CA (US);
Victor Zia, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 282 days.

This patent is subject to a terminal disclaimer.

(21) Appl. No.: 11/050,996

(22) Filed: Feb. 4, 2005

(65) Prior Publication Data

US 2006/0005103 A1  Jan. 5, 2006

Related U.S. Application Data

(63) Continuation-in-part of application No. 10/882,523, filed on Jun. 30, 2004.

(51) Int. Cl.
*G01R 31/28* (2006.01)
*G06F 11/00* (2006.01)

(52) U.S. Cl. .................... 714/726; 714/703
(58) Field of Classification Search ......... 714/100–824
See application file for complete search history.

(56) References Cited

U.S. PATENT DOCUMENTS

| | | | |
|---|---|---|---|
| 5,253,255 A | 10/1993 | Carbine | |
| 5,764,656 A | 6/1998 | Pelella et al. | |
| 6,023,778 A | 2/2000 | Li | |
| 6,654,944 B1 | 11/2003 | Dike | |
| 6,735,731 B2* | 5/2004 | Ewen et al. | 714/733 |
| 6,938,225 B2* | 8/2005 | Kundu | 716/1 |
| 2003/0046643 A1 | 3/2003 | Ohta et al. | |
| 2003/0222677 A1 | 12/2003 | Komaki | |
| 2004/0041610 A1 | 3/2004 | Kundu | |
| 2006/0236178 A1* | 10/2006 | Satsukawa et al. | 714/726 |

OTHER PUBLICATIONS

Mitra et al., "Robust System Design with Built-In Soft-Error Resilience," IEEE Computer Society, Feb. 2005, XP-002378078, pp. 43-52.

* cited by examiner

*Primary Examiner*—Guy Lamarre
*Assistant Examiner*—Merant Guerrier
(74) *Attorney, Agent, or Firm*—Schwabe, Williamson & Wyatt, P.C.

(57) ABSTRACT

In one embodiment, an apparatus is provided with a system circuit, a scanout circuit and an error detecting circuit. The system circuit is adapted to generate a first output signal in response to a data input signal and a system clock signal. The scanout circuit is adapted to generate a second output signal in response the data input signal and the system clock signal. The error detecting circuit, coupled to the system circuit and the scanout circuit, is adapted to generate an error signal in response to a relative condition between the first output signal and the second output signal.

30 Claims, 13 Drawing Sheets

| Mode | Action | Signal values | |
|---|---|---|---|
| | | SHIFT | LOAD |
| | Clear scanout data | 0 | 0 |
| | Load LDI data | 0 | 1 |
| | Shift SDI data | 1 | 0 |
| Snapshot | | 1 | 0 |
| Signature | | 1 | 1 |

FIG. 2 (PRIOR ART)

| Mode | SHIFT | LOAD | SCANOUT_EN | Description |
|---|---|---|---|---|
| Clear | 0 | 0 | 1 | Clear by loading scanout circuit (next stage) with 0 |
| Load | 0 | 1 | 1 | Load scanout circuit (next stage) with D |
| Shift | 1 | 0 | 1 | Shift by loading scanout circuit (next stage) with SDI |
| Signature | 1 | 1 | 1 | Load scanout cell (next stage) with XOR (D, SDI) |
| Self-checking | 1 | 1 | 0 | Compare the output of system circuit and scanout circuit; Produce an error flag if there is a mismatch |
| Non-protect | 0 | 0 | 1 | Disable error detection |

FIG. 5

| Mode | Action | Signal values | | |
|---|---|---|---|---|
| | | SHIFT | LOAD | SCANOUT_EN |
| | Clear scanout data | 0 | 0 | 1 |
| | Load D data | 0 | 1 | 1 |
| Snapshot | Shift SDI data | 1 | 0 | 1 |
| Signature | XOR (D & SDI) | 1 | 1 | 1 |
| Error blocking | Blocking SEU | 1 | 1 | 0 |
| Non-protect | Disable Blocking | 0 | 0 | 1 |

FIG. 8

| Mode | SHIFT | LOAD | SCANOUT_EN | SCA | SCB | CAPTURE | UPDATE | Description |
|---|---|---|---|---|---|---|---|---|
| Clear | 0 | 0 | 1 | 0 | 0 | 1 | 0 | Clear by loading scanout circuit (next stage) with 0 |
| Shift | 1 | 0 | 1 | 0 | 0 | 1 | 0 | Shift by loading scanout circuit (next stage) with SDI |
| Load | 0 | 1 | 1 | 0 | 0 | 1 | 0 | Load scanout circuit (next stage) with D |
| Signature | 1 | 1 | 1 | 0 | 0 | 1 | 0 | Load scanout circuit (next stage) with XOR (D, SDI) |
| Test | 0 | 0 | 0 | See waveforms in Fig. 12 | | | | Test |
| Self-checking | 1 | 1 | 0 | 0 | 0 | 1 | 0 | Compare the output of system and scanout / scan circuits & Produce an error flag if there is a mismatch |
| Non-protect | 0 | 0 | 0 | 0 | 0 | 0 | 0 | Disable error detection |

FIG. 11

SYSTEM AND SCANOUT CIRCUITS WITH ERROR RESILIENCE CIRCUIT

CROSS-REFERENCE TO RELATED APPLICATIONS

This application is a continuation-in-part of copending U.S. patent application Ser. No. 10/882,523, filed Jun. 30, 2004, entitled "Error Detecting Circuit", and copending U.S. patent application Ser. No. 11/044,826, filed Jan. 26, 2005, entitled "System And Shadow Circuits With Output Joining Circuit", both of which are hereby fully incorporated by reference.

BACKGROUND

1. Technical Field

Embodiments of the present invention are related to the field of electronic devices, and in particular, to operation resiliency to errors in electronic devices.

2. Description of Related Art

Single event upsets (SEUs), also referred to as soft errors (SERs), are radiation-induced transient errors in digital systems caused by high energy particles such as neutrons generated from cosmic rays and alpha particles from packaging material. For designs manufactured at advanced technology nodes (130 nm, 90 nm, and so on), SEUs are gaining in importance. Hence, soft errors may be significant for microprocessors, network processors, high end routers and network storage components that target enterprise and applications with very high reliability, data integrity and availability. More specifically, bistables (latches and flip-flops) may be major contributors to the system-level soft error rate.

One of the problems presented by the increased complexity of modern very large scale integrated (VLSI) chips is the difficulty in debugging them and qualifying them for full production. A scanout mechanism helps designers to observe important internal states of internal nodes in the chip in a non-intrusive manner during normal operation (in real time). The scanout mechanism includes the ability to capture the observed signals and to serially shift them out so as to simplify the isolation of circuit, speed, logic and microcode bugs. Scanout implementations in major high-end microprocessors involve significant circuitry and clock signals that are used only during post-silicon debug and production testing. These resources generally are not used during normal system operation, although they occupy additional area and draw additional leakage power.

Referring to FIG. 1, a system/scanout cell 10 may have a scanout circuit 12 and a system circuit 14. To implement a scanout function in a chip, such as a processor chip, one or more shift registers (often referred to as scanout chains) are arranged in the chip by serially connecting a plurality of scanout circuits 12 (only one cell shown) so as to observe key internal states at various internal test nodes. Such internal nodes frequently are chosen for their strategic importance in the chip's operation (hence important for debug). Both the scanout and system circuits 12 and 14 are coupled to receive the same data from one of the internal test nodes. This data may be generated by an upstream combinational logic circuit (not shown). The scanout circuit 12 includes a first latch LA and a second latch LB configured in a master/slave relationship and the system circuit 14 includes a first latch PH2 and a second latch PH1 configured in a master/slave relationship. The scanout circuit 12 further includes an Exclusive OR (XOR) gate 16 having inputs from two AND gates 18 and 20, with the AND gate 18 having as inputs a signal SHIFT and a shifted data input signal SDI and AND gate 20 having as inputs a signal LOAD and a data signal D. Referring a truth table in FIG. 2, the system/scanout cell 10 typically has two scanout modes of operation: "snapshot" and "signature" modes, with the two modes being determined by the states of the signals LOAD and SHIFT.

BRIEF DESCRIPTION OF THE DRAWINGS

FIG. 2 is a truth table for the system/scanout cell of FIG. 1.

FIG. 5 is a truth table for the system/scanout cell of FIG. 4.

FIG. 8 is a truth table for the system/scanout cell of FIG. 7.

FIG. 11 is a truth table for the system/scanout/scan cell of FIG. 10.

DETAILED DESCRIPTION OF ILLUSTRATIVE EMBODIMENTS

In the following description, for purposes of explanation, numerous details are set forth in order to provide a thorough understanding of the disclosed embodiments of the present invention. However, it will be apparent to one skilled in the art that these specific details are not required in order to practice the disclosed embodiments of the present invention. In other instances, well-known electrical structures and circuits are shown in block diagram form in order not to obscure the disclosed embodiments of the present invention.

Various embodiments according to the present invention are directed toward protecting sequential system circuits (e.g., latches and flip-flops) from soft errors and more particularly, from single event upsets (SEUs). This protection may be achieved by enabling the system circuits with built-in resilience to soft errors, either by incorporating error detecting (self-checking) circuits in some embodiments or error blocking circuits in other embodiments. The error detecting circuits and the error blocking circuits may be generically referred to as "error resilience circuits", in that they provide resilience or resistance to errors either through detection of errors or blocking of errors. Additionally, in one embodiment, the error detecting circuit also may incorporate error trapping circuit for trapping a detected error for subsequent collection. The scanout circuits may be located to observe internal test nodes in an integrated circuit (IC) chip. Such monitored internal nodes may contain key states important to the operation of the IC chip, making their protection of increased significance.

The on-chip system/scanout cells, according to the various embodiments of the present invention, each contains a system circuit and a scanout circuit. These system/scanout cells may achieve the above-described soft error rate detection or reduction by opportunistically reusing existing scanout circuits that otherwise would have remained dormant during normal (functional) system operation. The opportunity for "scanout reuse" arises from the fact that the scanout circuit may be reconfigured to provide a redundant data storage circuit for the system circuit to be protected. Under the assumption of a single event upset (SEU), a particle strike may at most flip the contents of one bistable in either the system circuit or the reconfigured scanout circuit, but not both. Hence, at least one correct copy of the system data remains inside the system/scanout cell, even when a soft error event has occurred. This scanout reuse may directly translate into savings in power and on silicon area of the IC chip as compared to other designs which do not reuse existing on-chip resource.

Figure 3:
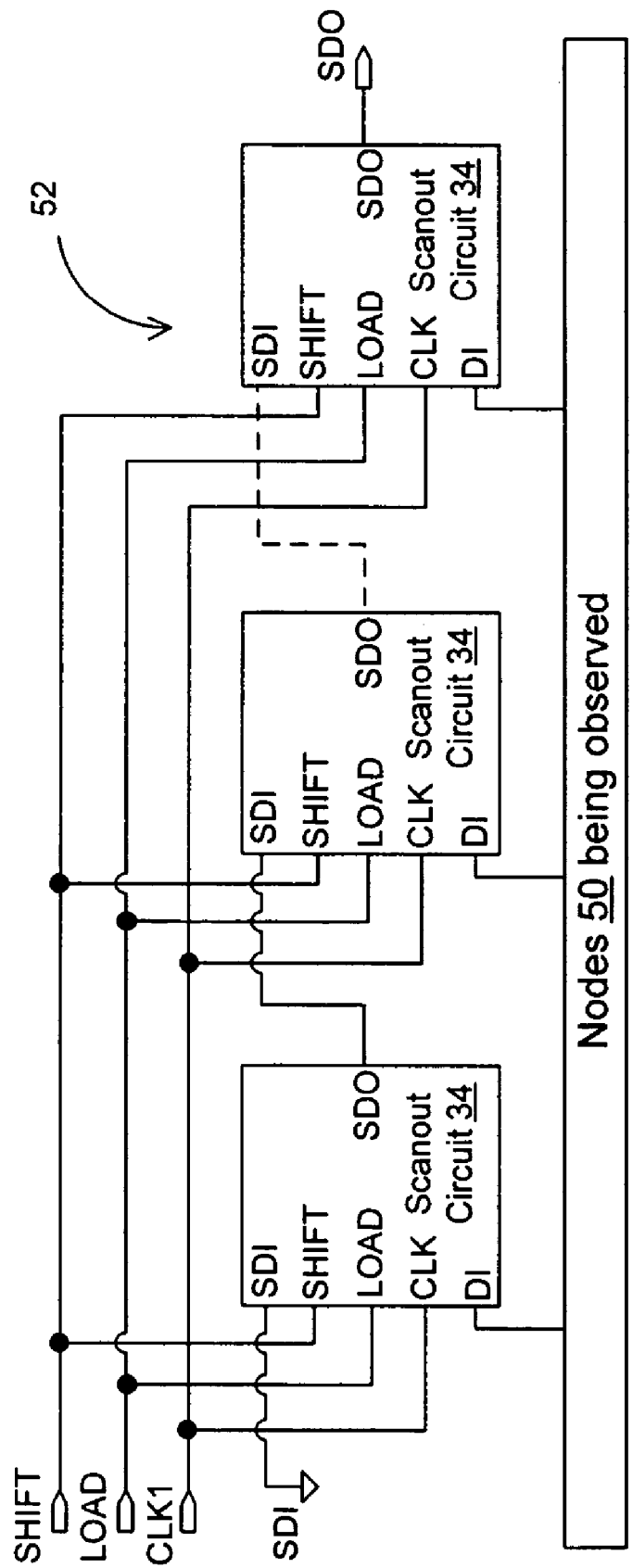
FIG. 3 is a circuit schematic of a shift register formed from serially chained scanout circuits, according to one embodiment of the present invention, coupled to internal nodes of a chip.
Figure 4:
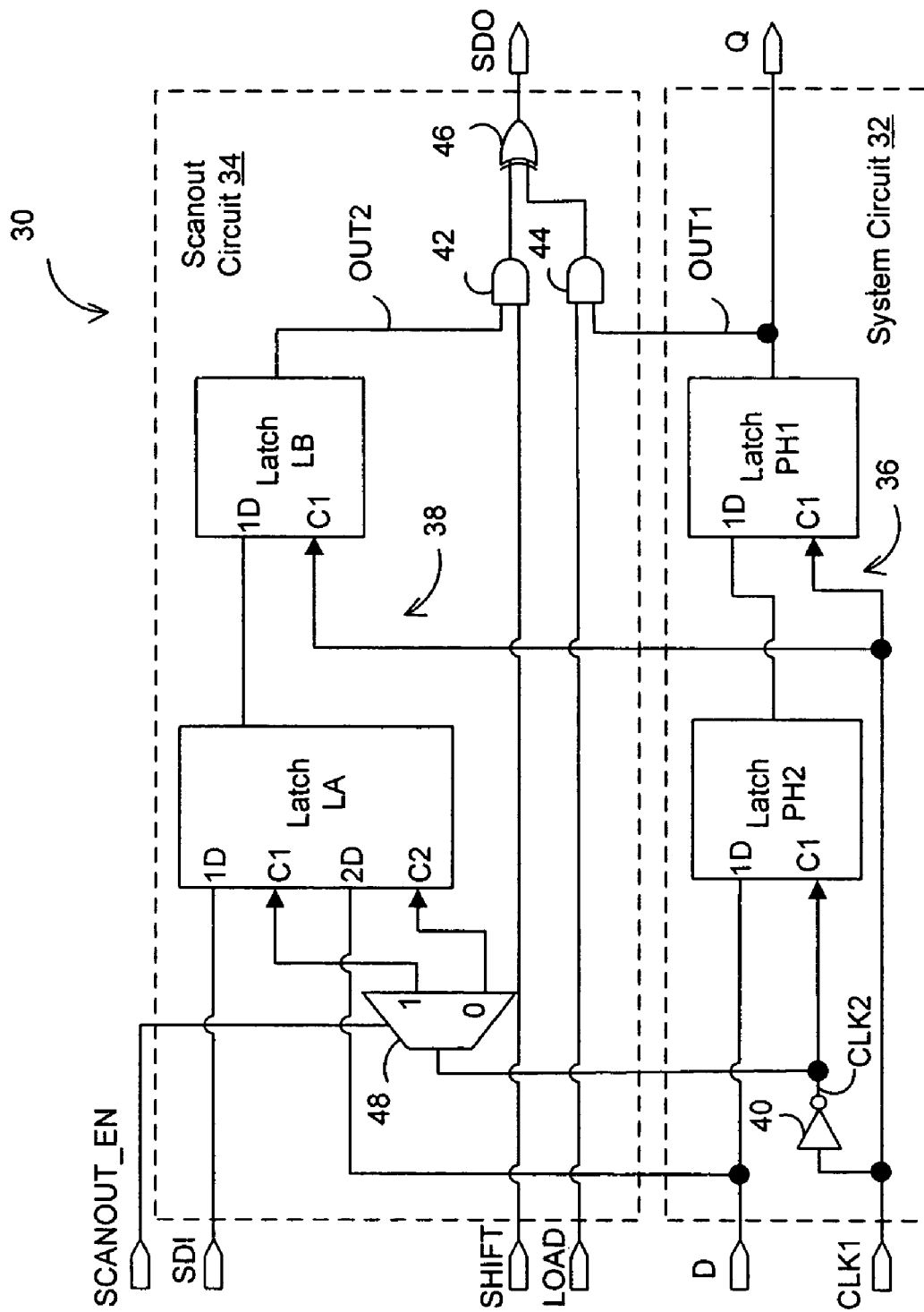
FIG. 4 is a circuit schematic of one of the system/scanout cells with error detection, according to one embodiment of the present invention.

Referring to FIGS. 3 and 4, there is illustrated a system/scanout cell 30 which includes a system circuit 32 and a scanout circuit 34. In one embodiment, the system circuit 32 may include system flip-flop 36 having a first system latch PH2 and a second system latch PH1 configured to have master/slave latch relationship. In one embodiment, the scanout circuit 34 may include a scanout flip-flop 38 having a first scanout latch LA and a second scanout latch LB also configured to have a master/slave latch relationship. The latches PH2 and LA may be referred to as master latches and the latches PH1 and LB may be referred to as slave latches. A data signal D is commonly provided to the latches PH2 and LA, such data being provided from one of the monitored internal nodes and which may have been generated by a combinational circuit (not shown) upstream of the internal node. In another embodiment, the system and scanout circuits 32 and 34 may each be a single latch in a latch-based clocking system, instead of each circuit 32 or 34 having a master and a slave latch.

For the purposes of illustration, the flip-flops 36 and 38 are shown as positive edge-triggered flip-flops using two phases of the same system clock, which include the clock signal CLK1 (non-inverted phase) and clock signal CLK2 (inverted phase) with an inverter 40 providing the inverted phase. However, in another embodiment, two different clock sources may be used for the clock signals. In yet another embodiment, the same clock phase may be used with both stages of flip-flops formed by cascading a negative latch (master latch) and a positive latch (slave latch). Likewise, a system/scanout cell may be constructed with negative edge-triggered flip-flops which may be used and constructed according to the same principles.

The scanout circuit 34 may further include interface circuitry for coupling the system and scanout circuits 32 and 34 and for coupling the scanout circuit 34 to other scanout circuits 34. In one embodiment, such interface circuitry may include a pair of AND gates 42 and 44, an XOR gate 46, and a clock switching circuit in the form of a demultiplexer (switch) 48. The AND gate 42 may have two inputs coupled to the output of latch LB and to the signal SHIFT and an output coupled to a first input of the XOR gate 46. The AND gate 44 may have two inputs coupled to the output of latch PH1 and to the signal LOAD and an output coupled to a second input of the XOR gate 46. The XOR gate 46 may provide a shifted data output signal SDO on its SDO output terminal, which is the output for the scanout circuit 34. The latch PH1 may provide a system data output signal Q on its Q output terminal, which is the output for the system circuit 32. The demultiplexer 48 may have the inverted clock signal CLK2 as an input and may be switched to provide the inverted clock signal CLK2 to either the C1 or C2 clock input of the latch LA based upon a scanout enable signal SCANOUT_EN. Hence, by adding the demultiplexer 48 (clock switching circuit) in front of the latch LA, the inverted clock signal CLK2 may be reconfigured in comparison to the clock configuration of FIG. 1. When the inverted clock CLK2 is provided to the input C1 of the latch LA, the shifted data input signal SDI from the upstream system/scanout cell 30 may be captured by the latch LA and when the inverted clock CLK2 is provided to the input C2 of the latch LA, the data signal D may be captured by the latch LA. The non-inverted clock signal CLK1 may be coupled to inputs of the slave latches PH1 and LB. As shown in FIG. 3, the SHIFT, LOAD, and CLK1 signals may be provided to all the scanout circuits 34 and the shifted data output signal SDO of an upstream scanout circuit 34 may provide the shifted data input signal SDI to a downstream scanout circuit 34. Since the signals SDO and SDI specify the same signal between directly connected system/scanout cells 30, they may be generically referred to as the "shifted data signal". The system circuits 32 of FIG. 4 are embedded at internal nodes 50 of FIG. 3 which are being observed.

Figure 1:
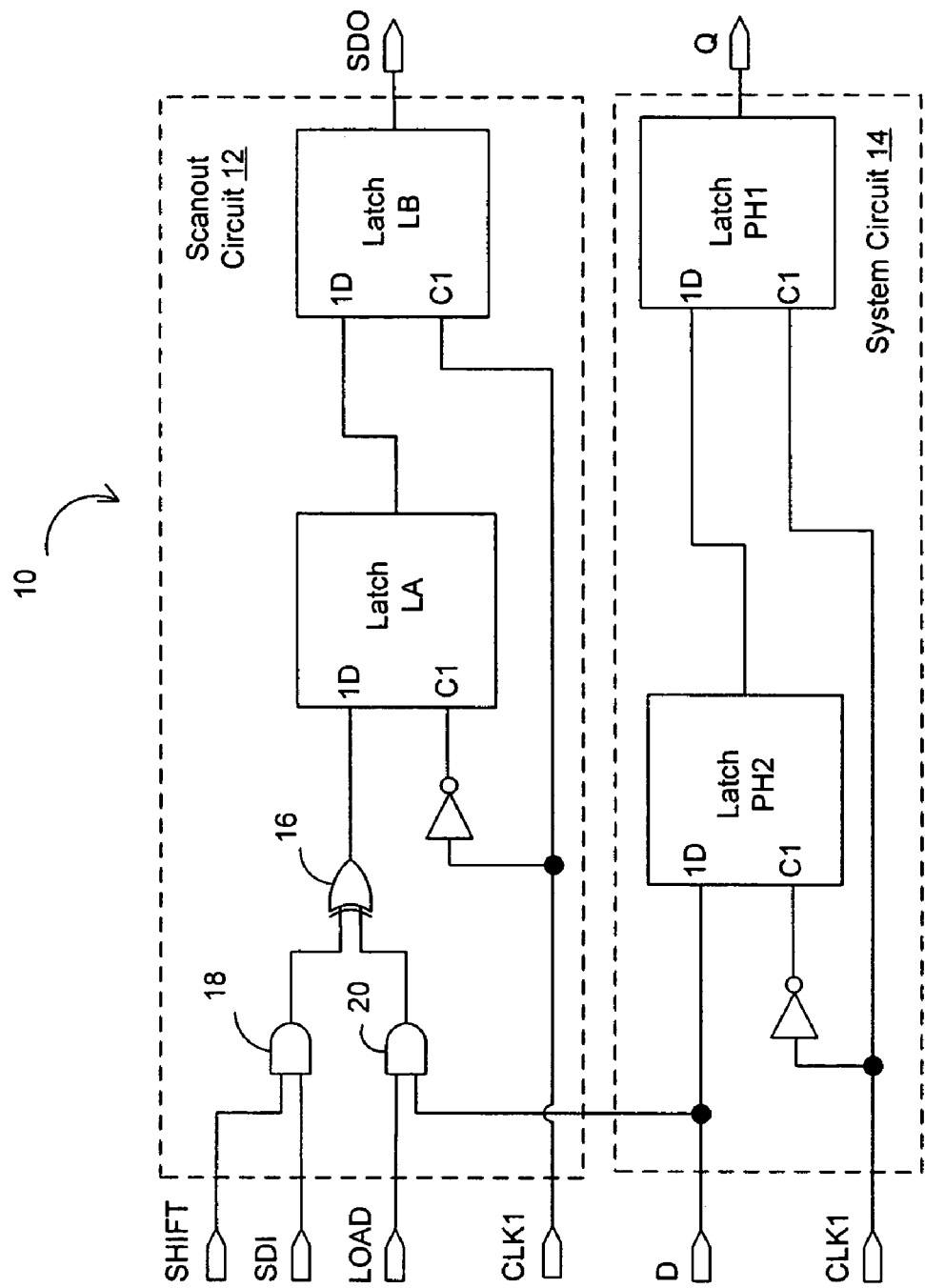
FIG. 1 is a circuit schematic of a conventional system/scanout cell.

Although the cluster of logic gates (AND gates 42 and 44 followed by XOR gate 46) are shown at the end of the scanout circuit 34, in another embodiment this cluster may be placed at the beginning of the scanout circuit 34 in front of the master latch LA as shown in FIG. 1. This embodiment may perform the same functionality as the one shown in FIG. 4. However, it may be applicable to relatively low speed applications because placing the cluster of logic gates in front of the master latch LA may impact setup time of the flip-flop 38.

To the extent the system/scanout cell 30 has been described to this point, the description of the circuitry also is applicable to other system/scanout cell embodiments of FIGS. 5-10; hence, this description will not be repeated for these subsequently described system/scanout cell embodiments. Next, the error detecting function of the system/scanout cell 30 will be discussed. Referring to FIG. 5, a truth table is illustrated describes four modes of operation: self-checking mode, non-protect mode, snapshot mode, and signature mode. The self-checking mode of operation is a first functional mode of operation wherein an error detection function is enabled when the system/scanout cell 30 is in a self-checking configuration. The non-protect mode of operation is a second functional mode of operation wherein the error detection function is disabled when the system/scanout cell 30 is in a non-protect configuration. The snapshot and signature modes may be referred to as scanout modes of operation for undertaking a scanout function when the system/scanout cell 30 is in a scanout configuration. The four modes of operation are enabled or disabled by the signals SHIFT, LOAD, and SCANOUT_EN. The snapshot mode utilizes three sub-modes or stages: clear, load, and shift. It should be noted that the scanout function (snapshot and signature modes) are the same throughout the various embodiments of the system/scanout cells and are essentially the same as the prior art shown in FIG. 1; hence, the scanout function (mode) will only be described in detail once for all the embodiments.

Referring to FIGS. 3-5, the self-checking mode of operation, which provides the error detection function, is used during normal operation of the IC chip when the error detecting function is enabled. The self-checking mode of operation is discussed first, even though this mode is likely to be used after the later-discussed modes relating to the scanout function, which are used during debug or production testing. In the self-checking mode, the XOR gate 46 is reused as an error detecting circuit. During the self-checking mode, the scanout function may be disabled by setting the signal SCANOUT_EN low so that the inverted clock signal CLK2 is used to capture the data signal D. The control signals LOAD and SHIFT may be set high so that the AND gates 42 and 44 pass on first and second output signals OUT2 and OUT1 of the latches LB and PH1, respectively, to the error detecting circuit (XOR gate 46). The output terminals of the latches LB and PH1 having the output signals OUT2 and OUT1 may be referred to as the OUT2 and OUT1 output terminals, respectively. The XOR gate 46 compares the outputs of the latches LB and PH1 and if they match (OUT2=OUT1), the SDO output terminal of the XOR gate 46 is a logic value 0 (no flag or error signal). In the event the occurrence of a soft error in either the system circuit 32 or the scanout circuit 34, these two outputs will likely to have a relative condition of not matching (OUT2≠OUT1) and the SDO output terminal of the XOR gate 46 may be a logic value 1, which may act as an error flag (an error signal) showing the relative condition of a data mismatch. Hence, the scanout circuit 34 may be reused during normal functional operation of the IC chip, where it would not otherwise be used, to perform the self-checking function. It should be noted that the XOR gate 46, which forms the error detecting circuit, is already available in the scanout circuit 34 since it is used in the scanout function described hereinafter. Further, in alternate embodiments, the invention may be practiced with other relative conditions.

In one embodiment, the non-protect mode of operation may be built into the system/scanout cell 30 for power-saving purposes or for other purposes. Hence, in this embodiment, there are both the self-checking and non-protect modes of operation. In the non-protect mode, the error-checking function is turned off so that the system/scanout cell 30 may consume power comparable to the system circuit 32 by itself. This non-protect mode provides flexibility, especially for non-critical applications. In general, the non-protect mode may be achieved by reducing or eliminating switching activity either at the clock input C2 or the data input D2 of the latch LA or at both the clock and data inputs C2 and D2 of the latch LA. As shown in FIG. 5, one way to achieve the non-protect mode may be to have the signal SCANOUT_EN set to 1 and signals LOAD and SHIFT set to 0, so as to ensure that switching activity (and its associated power consumption) at the data input 2D of the latch LA is eliminated. Another way to implement the non-protect mode may be to place an AND gate between the clock signal CLK2 source and the multiplexer 48, with the second input to the AND gate being used to disable the clock signal to the clock input terminal 48 (discussed in more detail with respect to FIG. 10). Additionally, there are a number of other ways in which the non-protect mode may be implemented to eliminate or reduce switching activity. In yet another embodiment, the non-protect mode may be eliminated.

Next, the scanout function (snapshot and signature modes) will be discussed, which is the same for all the system/scanout cell embodiments, according to the various embodiments of the present invention. The scanout function is activated by the enable signal SCANOUT_EN being set high; hence, the self-checking function is disabled. As shown in FIG. 3, the scanout circuits 34 (and therefore the system/scanout cells 30) may be configured to form a scanout shift register (scanout chain) 52 implemented by the scanout circuits 34 being connected sequentially. More specifically, the shifted data output signal SDO of an upstream scanout circuit 34 may become the shifted data input signal SDI for the next downstream system/scanout cell 34. With these modes of the scanout function, the SDO output terminal of the last scanout circuit 34 in a given chain 52 may be coupled an external tester (not shown). Each scanout circuit 34 may be referred to as one of the stages of the scanout chain 52, with the scanout chain 52 defining a scanout path for shifting data to the external tester. With the scanout function, the external tester may also control the signals SHIFT and LOAD. An IC chip may include a plurality of scanout chains 52.

As previously mentioned, in one embodiment, the scanout function may have two different modes of operation: a snapshot mode and a signature mode. In another embodiment, only one of these modes may exist. The snapshot mode may be used for component debug. The scanout circuits 34 of the scanout chain (shift register) 52 may be first loaded in parallel with data from the internal test nodes 50 (data also fed to the system circuits 32), thereby taking a snapshot of the internal states of interest at a desired clock cycle. The data then may be shifted out by the scanout chain 52 serially, one bit per clock cycle. A comparison between this output data and desired results at the external tester (not shown) may indicate the existence of any bugs. This process may be repeated by looping back to the beginning of the test to take another snapshot one clock cycle later than the previous capture point of the test.

The signature mode may be used for increased observance of internal test nodes 50 during production testing. After loading the scanout chain 52 with data from the internal test nodes 50, the resulting parallel input vector is exclusive ORed by use of the XOR gate 46 with the previous contents of the upstream scanout circuit 34 in the scanout chain 52. Thus, the states of participating signals may be compressed to an equivalent serial-bit stream and may be shifted out on the last SDO output terminal of the scanout chain 52, one bit per clock cycle. In other word, the compressed, successive observed bits form a signature which may be examined externally by the tester.

For the scanout function, the snapshot mode may be implemented using the sub-mode operations or stages shown in FIG. 5 of clear, shift, and load. For the clear mode, with the enable signal SCANOUT_EN high, the signals SHIFT and LOAD may be set low in a given scanout circuits 34, which in turn clears the next scanout circuit 34 in the chain. In other words, the signals CLEAR and SHIFT both being low in turn forces the AND gates 42 and 44 to be low regardless of the values of the output signals OUT2 and OUT1 from the latches LB and PH1. Hence, the SDO output terminal of the XOR gate 46 is low, which may be fed as the shifted data input signal SDI to the next stage in the scanout chain 52 so as to clear it. For the shift mode, with the enable signal SCANOUT_EN high, the signal SHIFT may be set high and the signal LOAD may be set low in a given scanout circuit 34, which forces the output of the AND gate 44 to be a low and for the AND gate 42 to pass on the output signal OUT2 of the latch LB to the XOR gate 46; hence, this second output signal OUT2 of latch LB becomes the shifted data output signal SDO of the XOR gate 46 and the shifted data input signal SDI for the next scanout circuit 34 in the chain 52. For the load mode, with the enable signal SCANOUT_EN high, the signal SHIFT may be set low and the signal LOAD may be set high in a given scanout circuit 34, which forces the output of the AND gate 42 to be a low and the AND gate 44 to pass on the output signal OUT1 of the latch PH1 to the XOR gate 46; hence, this first output signal OUT1 of latch PH1 becomes the shifted data output signal SDO of the XOR gate 46 and the shifted data input signal SDI for the next scanout circuit 34 in the chain 52. As previously mentioned, the shifted data output signal SDO and the shifted data input signal SDI, which are the same when referring to the signal passing between two directly coupled scanout circuits 34, may be generically referred to as the "shifted data signal".

For the signature mode of operation, with the enable signal SCANOUT_EN high, the signals SHIFT and LOAD may be set high in a given scanout circuit 34, which causes the AND gates 42 and 44 to pass on the output signal OUT2 of the latch LB (the previous contents of the upstream scanout circuit 34) and the output signal OUT1 of the latch PH1 to the XOR gate 46; hence, the XOR gate 46 performs and exclusive OR operation on the two output signals OUT1 and OUT2 to provide a signature, which may be the shifted data input signal SDI for the next scanout circuit 34 in the chain 52. It should be noted that, the XOR gate 46 may generate the signature with the scanout function, whereas the XOR gate 46 may detect soft errors with the error checking function. Hence, XOR gate 46 previously existed in the prior art embodiment of FIG. 1 for the purpose of generating a signature and has been adapted in the system/scanout cell 30 also to perform the error detection function when in the self-checking mode.

Although one embodiment of the scanout circuit 34 has been shown which provides both a snapshot and signature mode, the scanout circuit 34 may take many different forms. For example, a simplified version of a scanout circuit, without the signature mode, may be achieved by eliminating the AND gates 42 and 44 (and the associated shift and load signals), XOR gate 46 and demultiplexer 48. In place of these elements, the latch LA may have a single clock input terminal coupled to the clock CLK2 and a single data input terminal coupled to an output terminal of a multiplexer. The multiplexer may have a first input terminal coupled to the shifted data input signal SDI and a second input terminal coupled to the system data input signal D, with selection of between its first and second input terminal being controlled by the signal SCANOUT_EN. This embodiment of the scanout circuit may still have the latch LA and latch LB in a master slave relationship, with the output of latch LB being the signal SDO. The scanout circuits used in subsequently discussed embodiments may also use this simplified scanout circuit.

When the system/scanout cell 30 is in its error checking mode, the error signal generated by the error detect circuit (XOR 46) needs to be observable. The system/scanout cells 30 may use an OR tree or signature register to achieve error detection. However, a different way of making the error signals observable is illustrated hereinafter in FIG. 6, which traps the error signal locally within the system/scanout cell and reuses the scanout chain 52 to shift the error out of the system/scanout cell at a desirable point in time, such as when undertaking a system check-pointing procedure.

Figure 6:
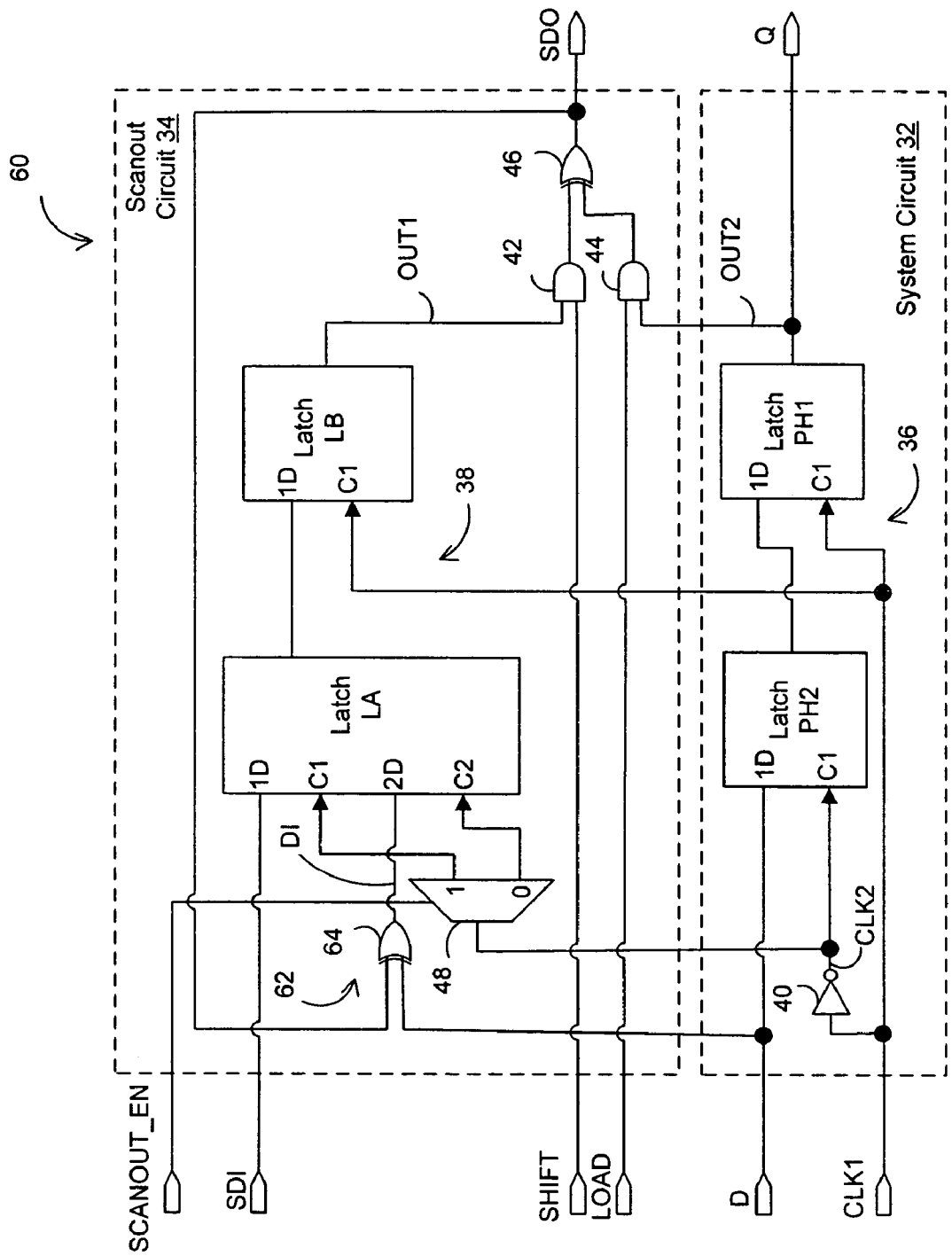
FIG. 6 is a circuit schematic of a system/scanout cell with error trapping, according to another embodiment of the present invention.

Referring to FIG. 6, a system/scanout cell 60, according to another embodiment of the present invention, includes an error-trapping circuit 62. With the exception of the error-trapping circuit 62, the remainder of the system/scanout cell 60 is the same as the system/scanout cell 30 of FIGS. 3-5; hence, the same components keep the same reference numerals and are not described again except as needed to explain the error-trapping circuit 62. In one embodiment, the error trapping circuit 62 may include an XOR gate 64 having one input coupled to the output of the XOR gate 46 and one input coupled to the data signal D. The output of the XOR gate 64 may be coupled to the 2D data input of the latch LA. This is in contrast to the system/scanout cell 30 of FIGS. 3-5 wherein the data signal D is directly coupled to the 2D data input of the latch LA.

As described previously, the XOR gate 46 may become an error detecting circuit during the self-checking mode and may generate an error signal on the SDO output terminal of the system/scanout cell 60 due to a soft error in either the scanout circuit 34 or system circuit 32. Referring to FIG. 6, the added error-trapping circuit 62 may allow for the error signal to be "trapped" by way of a feedback loop provided by the error-trapping circuit 62. This trapped error signal may be trapped until another soft error affects one of the latches, the occurrence of which is relatively improbable. More specifically, the error trapping circuit 62 may reconfigure the circuitry providing the inverted clock signal CLK2. Once a soft error has occurred (OUT2≠OUT1), an error signal is generated at the output of the gate XOR 46. This error signal then may be provided to the first input of the gate XOR 64, causing an output signal D1 of the gate XOR 64 to be complementary to the data input signal D. Upon the arrival of the rising edge of the clock signal CLK1, the data output signal D1 may be latched into the latch LB. Assuming no other soft error has occurred, which is consistent with SEU assumption, the gate XOR 46 would again report an error signal. Hence, this error signal may be equivalently "trapped" in this feedback loop.

After a pre-specified number of clock cycles, system-wide check-pointing may be performed. The scanout circuits 34 along the scanout chain 52 then may be formed into a shift register (in the same manner as undertaken with the scanout function) and may be used to shift out the error signals, if any. The use of the scanout shift eliminates the need for global routing of the error signal. This shifting out of the error signal from the scanout chain 52 may occur at a recovery point (e.g. at a checkpoint); hence, it does not require an extra checking stage. Error correction then may be achieved by re-execution from a previously committed valid check point. The error trapping circuit 62 may not interfere with the normal operation of system circuit 32 when no soft error has occurred, since the output of the XOR gate 46 (error flag signal) remains zero as long as the signals OUT1 and OUT2 agree.

Figure 7:
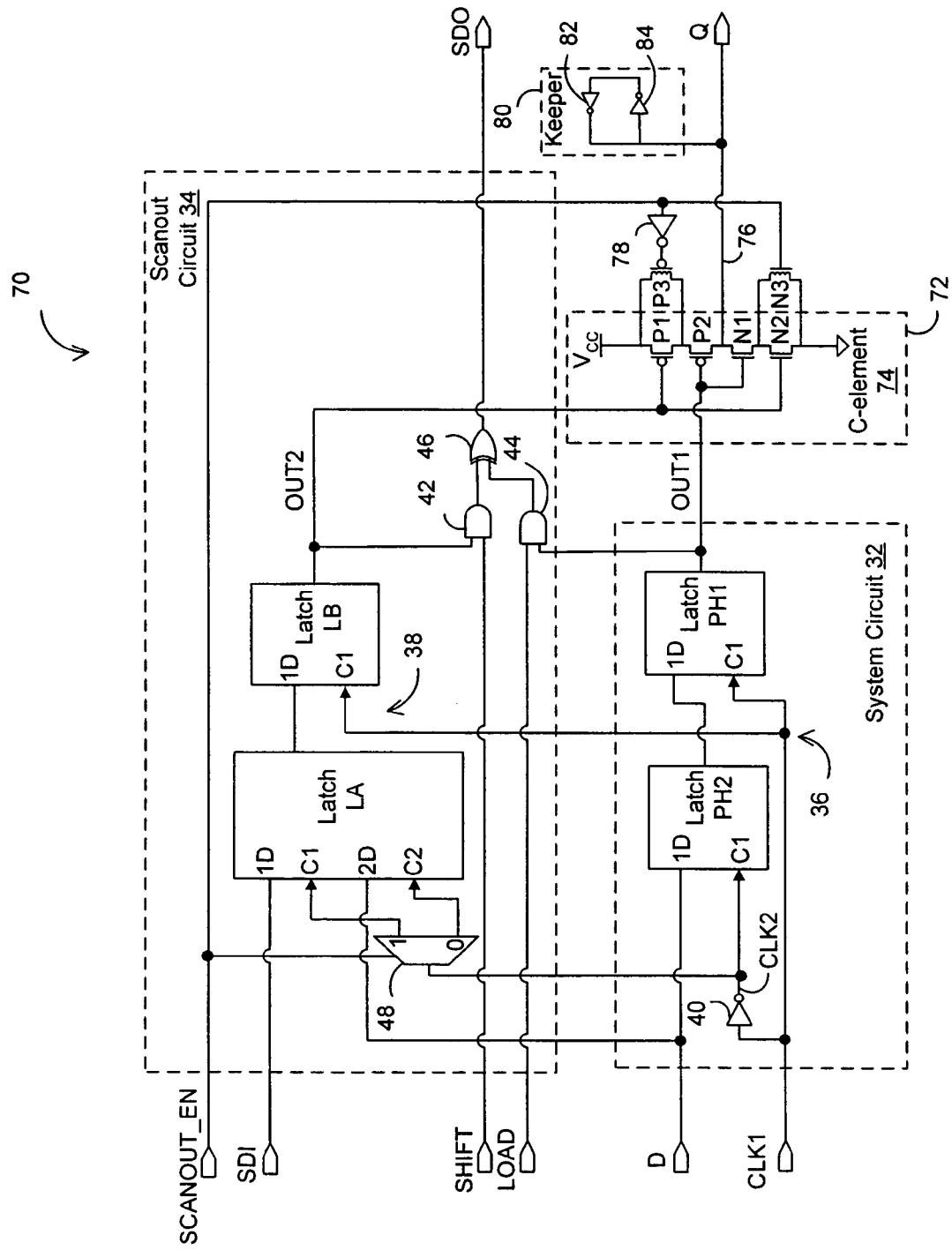
FIG. 7 is a circuit schematic of a system/scanout cell with error blocking by C-element, according to another embodiment of the present invention.

With reference to FIG. 7, a system/scanout cell 70, in accordance to another embodiment of the present invention, includes an output joining circuit 72 to provide blocking against soft errors. With the exception of the output joining circuit 72, the remainder of the system/scanout cell 70 is the same as the system/scanout cell 30 of FIGS. 3-5; hence, the same components keep the same reference numerals and are not described again except as needed to explain the output joining circuit 72. As will be described hereinafter, there are a number of different embodiments of the output joining circuit, with the output joining circuit 72 being just one example. Additionally, in another embodiment, the system and scanout circuits 32 and 34 may each include a single latch in a latch-based clocking system instead of the circuits 32 or 34 including a flip-flop as shown in FIG. 7.

In one embodiment as shown in FIG. 7, the output joining circuit 72 may include a C-element 74. This embodiment may be referred to as utilizing blocking by a C-element. The C-element 74 may have as inputs the first and the second output signals OUT1 and OUT2 and may have a system data output signal Q. The output of C-element circuit 74 may be high upon both signals OUT1 and OUT2 being low. The output of the C-element circuit 74 may be low upon the signals OUT1 and OUT2 being high. For all other input combinations, the output of the C-element may hold its previous value. Holding the previous value is desired when there is a soft error. The enable signal SCANOUT_EN, in addition to being coupled to the demultiplexer 48, may be coupled to the C-element 74 to enable and disable the C-element 74 in different modes to be described hereinafter. The C-element 74 may include in series two P-channel transistors P1 and P2 and two N-channel transistors N1 and N2. The transistor P1 may have its source coupled to the external supply voltage VCC and its drain coupled to the source of transistor P2. The transistor P2 may have its drain connected to an output node 76 for the system data output signal Q. The transistor N1 may have its drain coupled to the output node 76 and its source may be connected to the drain of the transistor N2. The transistor N2 may have its source coupled to ground. The gates of transistors N2 and P1 may be commonly coupled to the output signal OUT2 of the latch LB. The gates of transistors N1 and P2 may be commonly coupled to the output signal OUT1 of the latch PH1. A P-channel transistor P3 and an N-channel transistor N3 may be coupled in parallel with transistor P1 and transistor N2, respectively, with their gates coupled to an inverted version of the enable signal SCANOUT_EN (inverted by the inverter 78) and non-inverted enable signal SCANOUT_EN, respectively.

The various modes of operation of the system/scanout cell 70 are shown in FIG. 8. In the non-protect mode, the error-blocking function is turned off so that the system/scanout cell 70 may consume power comparable to the system circuit 32 by itself. This non-protect mode provides flexibility, especially for non-critical applications. As shown in FIG. 8, one way to achieve the non-protect mode may be to have the signal SCANOUT_EN set to 1 and signals LOAD and SHIFT set to 0, so as to ensure that switching activity (and its associated power consumption) at the data input 2D of the latch LA is eliminated. There are a number of other ways in which the non-protect mode may be implemented to eliminate or reduce switching activity. When the scanout function is activated by the enable signal SCANOUT_EN, the C-element 74 is disabled, because the value at second output signal OUT2 becomes a "don't-care" to the value at the output terminal Q. The snapshot and signature modes of the scanout function are the same as described with respect to the system/scanout cell 30 of FIGS. 3-5; hence, they will not be described again except for the following summary. When the enable signal SCANOUT_EN is high, the first data port of the latch LA is activated and the circuits enter the scanout configuration. The snapshot and signature modes may then be activated by assigning proper values to the signals SHIFT and LOAD as shown in FIG. 8.

With the signal SCANOUT_EN set low (scanout function disabled) and the signals SHIFT and LOAD set high, the system/scanout cell 70 is in its error blocking mode of operation and the second data port of the latch LA is activated. Two copies of the same data D are stored in the system circuit 32 and reconfigured scanout circuit 34 when the sampling clock edge completes its transition. At least one correct copy of the system data remains inside the system/scanout cell 70, even when a SEU has occurred. In an error blocking mode, the output terminal Q of the C-element 72 may be actively driven when the contents of the system circuit 32 and scanout circuit 34 match (OUT1=OUT2). If a particle strikes any bistable in the circuits 32 and 34 and flips its content, the first output signal OUT1 will not agree with the second output signal OUT2 and the correct state at the output terminal Q may be held because both the pull-up and pull-down paths in the C-element 74 are shut off.

In one embodiment, the output joining circuit 72 may further include a weak keeper circuit 80 coupled to the output node 76, which may include two inverters 82 and 84. In another embodiment, the weak keeper circuit 80 may not be needed. Many contemporary multi-GHz designs have a sufficiently short cycle time that the weak keeper circuit 80 may not be needed. However, in some embodiments, the system clock may be stopped for a long time if system-level power-saving mode is to be activated in an IC chip. If a particle strikes one of the latches and flips its state, leakage current may end up completely changing the state of output terminal Q given enough time. The weak keeper circuit 80 on the output node 76 may provide a solution to this issue. In summary, depending on the speed of the system and the leakage current, the weak keeper circuit 80 may not be necessary. The addition of the weak keeper circuit 80 does not change the operation of the system/scanout cell 70.

Figure 9:
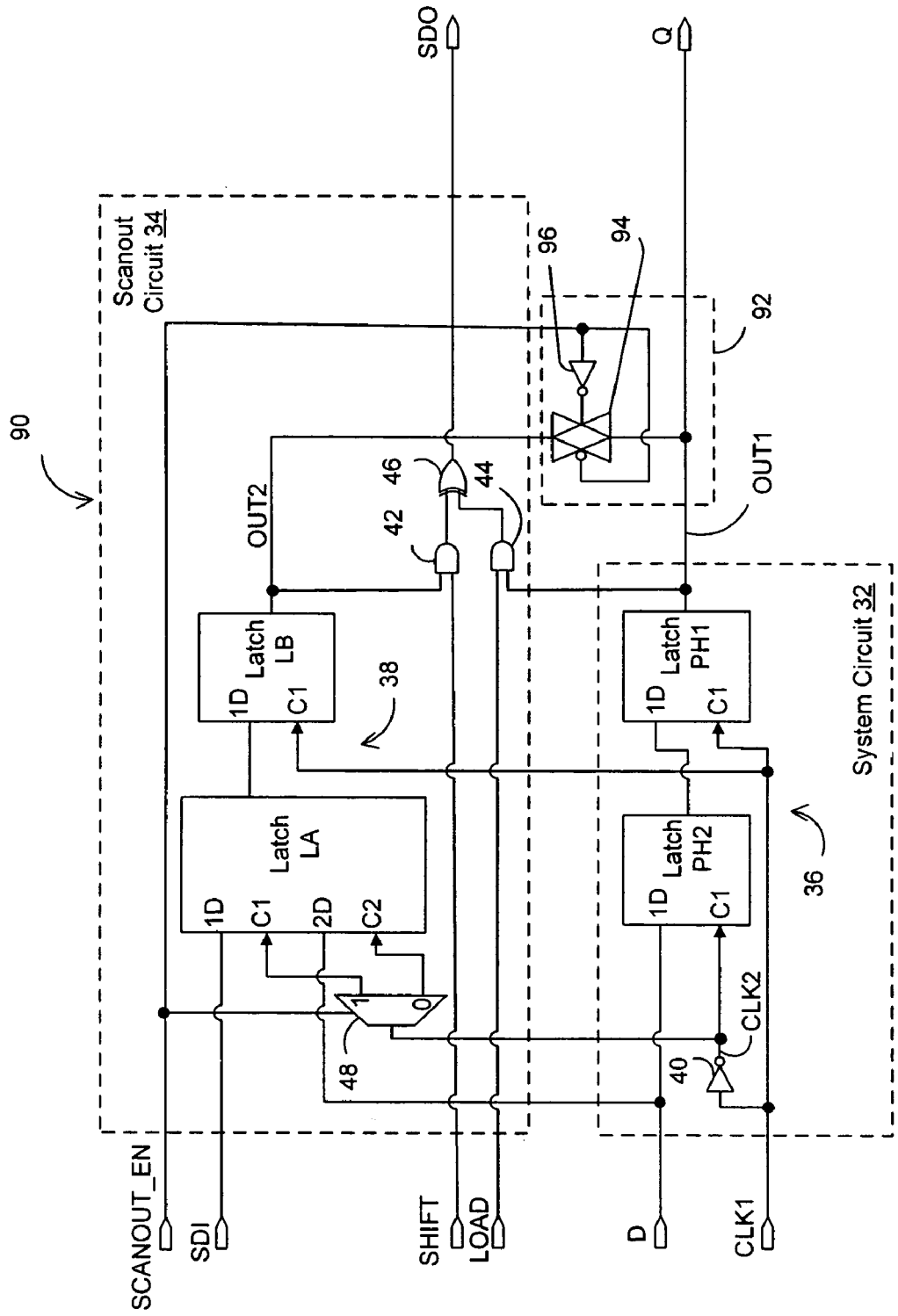
FIG. 9 is a circuit schematic of a system/scanout cell with error blocking by transmission gate, according to another embodiment of the present invention.

With reference to FIG. 9, a system/scanout cell 90, in accordance to another embodiment of the present invention, includes a different embodiment of an output joining circuit than shown in FIG. 7. More specifically, the system/scanout cell 90 may include an output joining circuit 92 in the form of a transmission gate 94 coupled between the first and second output terminals OUT1 and OUT2. This may be referred to as blocking by transmission gate. The enable signal SCANOUT_EN is coupled to a P-side of the transmission gate 94 and to the N-side of the transmission gate 94 through an inverter 96. With the exception of the output joining circuit 92, the remainder of the system/scanout cell 90 is the same as the system/scanout cell 30 of FIGS. 3-5; hence, the same components keep the same reference numerals and are not described again except as needed to explain the output joining circuit 92. Additionally, in another embodiment, the system and scanout circuits 32 and 34 may each comprise a single latch in a latch-based clocking system, instead of the flip-flops 36 and 38 shown in FIG. 9.

When the first and second output signals OUT1 and OUT2 of the flip-flops 36 and 38, respectively, are coupled together by use of the transmission gate 94, soft errors may be mitigated. More specifically, the node capacitance and transistor drive at the output nodes increase, which in turn results in a reduction in SER. First, the more capacitance there is, the more difficult it is to disturb the initial state of the impacted latch. More specifically, when the soft error particle impacts the latch, it charges or discharges the capacitance. The more capacitance there is for the initial state of the latch, the longer it takes to disturb the initial state; therefore, it is harder to corrupt the initial state and the less likely the initial state will change. Second, there are two transistors or gates trying to hold the initial state.

In another embodiment (not shown), the output joining circuit 92 of the system/scanout cell 90 of FIG. 9 may be modified to include a second transmission gate coupled between the outputs of the latches LA and PH2. Again, the enable signal SCANOUT_EN may be coupled to a P-side of the second transmission gate and to the N-side of the second transmission gate through an inverter. In other words, in this embodiment, the first transmission gate may couple the outputs of the two slave latches LB and PH1 (as shown in FIG. 9) and the second transmission gate may be coupled to the outputs of the two master latches LA and PH2, with the enable signal SCANOUT_EN enabling both of the transmission gates during a blocking mode of operation and disabling both of the transmission gates during the activation of the scanout function.

Figure 10:
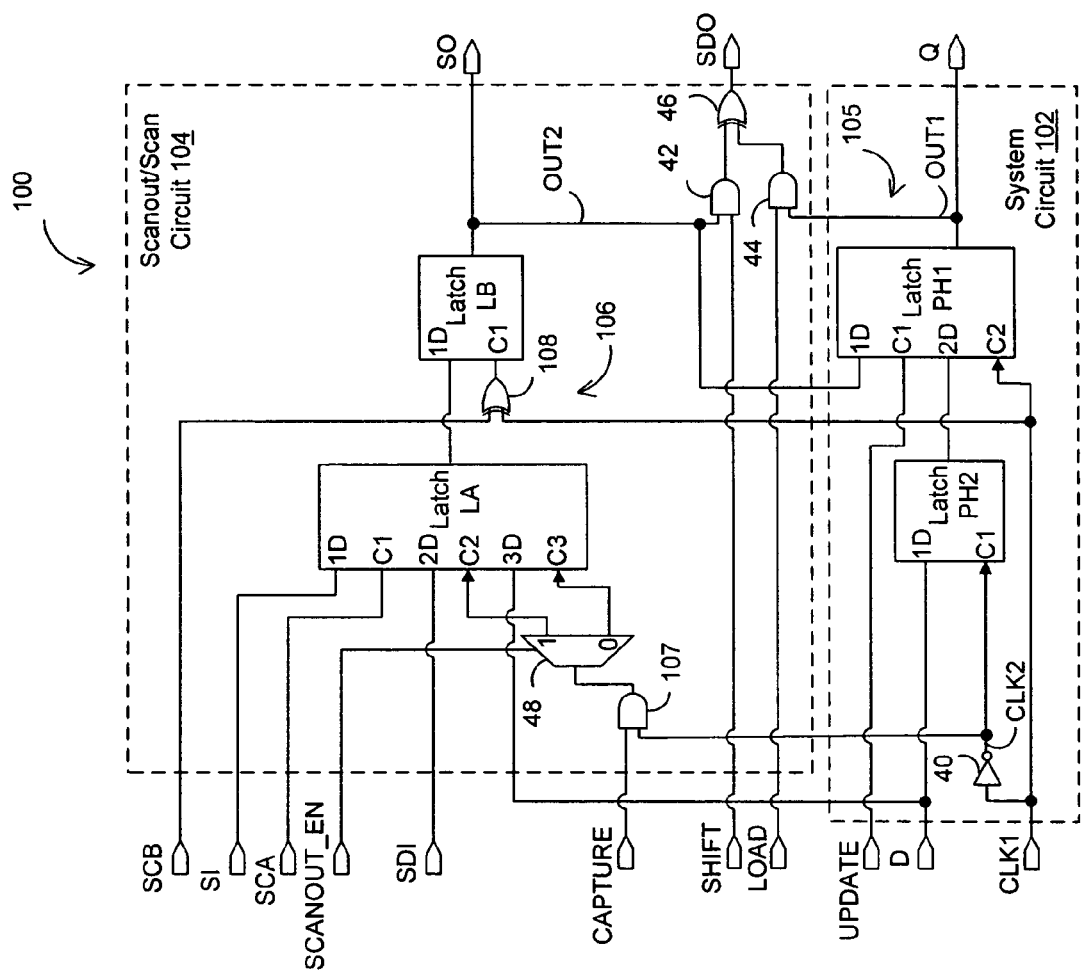
FIG. 10 is a circuit schematic of a system/scanout/scan cell with error detection, according to another embodiment of the present invention.

The system/scanout cells 30, 60, 70 and 90 of FIGS. 4, 6, 7, and 9, respectively, may be modified to include a scan function in addition to a scanout function. For purposes of illustration, only the system/scanout cell 30 directed toward error detection will be shown modified to include the scan function; however, all the other system/scanout cells may be accordingly modified in the same manner. Referring to FIG. 10, the scanout/scan cell 100 is the same as system/scanout cell 30 of FIG. 4, except the scanout/scan cell 100 is modified to include a scan function. The scanout/scan cell 100 includes a system circuit 102 and a scanout/scan circuit 104. In one embodiment, the system circuit 102 may include system flip-flop 105 having a first system latch PH2 and a second system latch PH1 configured to have master/slave latch relationship. The scanout/scan circuit 104 may include a scanout/scan flip-flop 106 having a first scanout/scan latch LA and a second scanout/scan latch LB configured to have a master/slave latch relationship. In one embodiment, to add the scan function, the following elements may be added: a clock control circuit in the form of AND gate 107, an OR gate 108, another data port 1D and clock port C1 for the latch LA, and another data port 1D and clock port C1 to the latch PH1. The AND gate 107 may have one input coupled to a CAPTURE signal, another input coupled to the clock signal CLK2, and an output coupled to the input of the demultiplexer 48. The OR gate 108 has one input coupled to a scan clock SCB, one input coupled to the clock signal CLK1, and an output coupled to the clock input of the latch LB. The 1D input of the latch LA receives a scan-in (test vector) signal SI and the C1 clock input receives a scan clock SCA. The 1D input of the latch PH1 may be coupled to the output signal OUT2 of the latch LB and the C1 clock input of the latch PH1 may be coupled to a signal UPDATE. The scan clocks SCA and SCB may be two phases of the same scan clock, which may be provided by an external tester device. A scan chain may include a plurality of scanout/scan circuits 104 organized into a shift register. The timing for the scan chain may be more relaxed than that of the scanout chain 52 of FIG. 3. In one embodiment, the scanout/scan circuit 104 may be part of both a scan chain and a scanout chain. The two chains do not necessarily overlap. With the exception of circuitry added or rearranged for the incorporation of the scan function into the scanout/scan cell 100 as described above, the remainder of the scanout/scan cell 100 is the same as the system/scanout cell 30 of FIGS. 3-5. Hence, the same components keep the same reference numerals and are not described again except as needed to explain the added scan function.

The scan function generates an additional mode of operation referred to as a TEST mode in FIG. 11. In a test mode of operation, the IC chip including a plurality of scanout/scan cells 100 of FIG. 10 which may be chained together into one or more serial shift registers to form one or more scan path, with each scan path being coupled to the external test device. The test mode of operation, sometimes referred to as Scan Design-For-Testability (DFT), may avoid sequential-test problems by turning flip-flops or latches of the scanout/scan cells 100 at input and output nodes of combinational logic circuits (not shown) into externally loadable and readable elements. In a scan-in shift operation, serial data of an appropriate test pattern (vector) is loaded into the scanout/scan cells 100 to set each of the scanout/scan cells 100 to a predetermined state. Once set, the test pattern propagates through the logic circuits (not shown) to generate a system response to the test pattern. In a capture operation, the scanout/scan cells 100 function to latch (capture) the system response. In a scan-out shift operation, the system response is shifted out of the IC chip and analyzed for improper operation by the test device. In one embodiment, the test device may provide the scan clock signals SCA and SCB and the signals CAPTURE and UPDATE to the IC chip.

The modes of operation are shown in FIG. 11 with the appropriate setting of signals to trigger a given mode. For the test mode, the signals SHIFT, LOAD, and SCANOUT_EN are set low. The clock signals SCA and SCB and the signals CAPTURE and UPDATE are described in a timing diagram of FIG. 12. With an activated scanout function (snapshot or signature modes of operation) or with an activated self-checking mode of operation, the test clocks SCA and SCB and the UPDATE signal may be set low and signal CAPTURE may be set high. The only change needed to go from the self-checking mode to the non-protect mode is to change the signal Capture from a 1 to a 0 so as to disable the clock and change the signals SHIFT and LOAD to 0 so as to ensure that there is no toggling at the input of the XOR gate 46. The prior embodiments not having the scan function (just the scanout function) may be modified to include the AND gate 107 so as to provide another way of achieve the non-protect mode.

Figure 12:
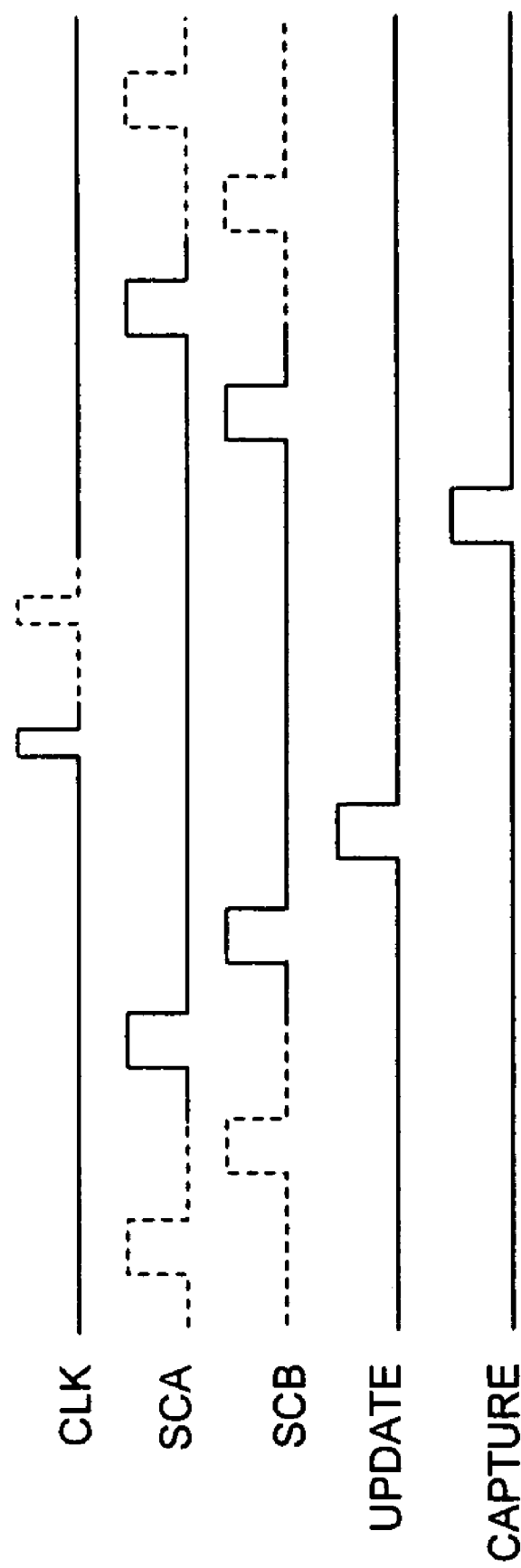
FIG. 12 is a timing diagram for the scan mode of operation of the /system/scanout/scan cell of FIG. 10

Referring to FIGS. 10 and 12, the test mode of operation for the scanout/scan cell 100 will now be described. The scan clock signals SCA and SCB (left side of diagram of FIG. 12) may be alternately applied to shift a test pattern into the latches LA and LB of the scanout/scan cells 100 forming a scan chain. Next, with respect to a given scanout/scan cell 100, the signal UPDATE may be applied to move the contents of the latch LB to the latch PH1. Thus, a portion of the test pattern (e.g., logic value "0" or "1") has been written into the system flip-flop 105, allowing the portion of the test pattern to be applied to a downstream combinational logic circuit. It should be noted that a given scanout/scan cell 100 in the scan path (but not at the beginning or end of the scan chain) may not only apply a portion of the test pattern (e.g., logic value "0" or "1") to the downstream combinational logic circuit, but the given scanout/scan cell 100 also may latch (capture) a portion of the system response (e.g., logic value "0" or "1") generated by another portion of the test pattern applied to an upstream combinational logic circuit. The signal CAPTURE may be set to allow capture of the portion of the system response from the upstream combinational logic circuit by directly shifting the received portion of the system response into the scanout/scan flip-flop 106. More specifically, the sampling of the received portion of the system response (data input signal D) at the 3D input of the latch LA may be triggered by a rising edge of the signal CAPTURE when the inverted system clock signal CLK2 is high. Thereafter, the system response from the scanout/scan cells 100 in the scan chain may be scanned out (shifted out) of the serially-connected scanout/scan flip-flops 106 by again alternately applying the scan clocks SCA and SCB (right side of diagram of FIG. 12). A scanout/scan cell 100 at the beginning of a scan path would only apply a portion of the test pattern (not receive a portion of the system response) and a scanout/scan cell 100 at the end of a scan path would only receive a portion of the system response (not apply a portion of the test pattern).

In summary, the opportunity for scanout reuse for soft error resilience arises from the fact that there are redundant scanout resources (e.g., latches LA and LB), which are unused during normal operation, but still occupy chip area and consume leakage power during normal system operation. These two latches (LA and LB) may be configured to act as a scanout flip-flop during normal system operation to enable redundant storage of the system flip-flop contents.

Figure 13:
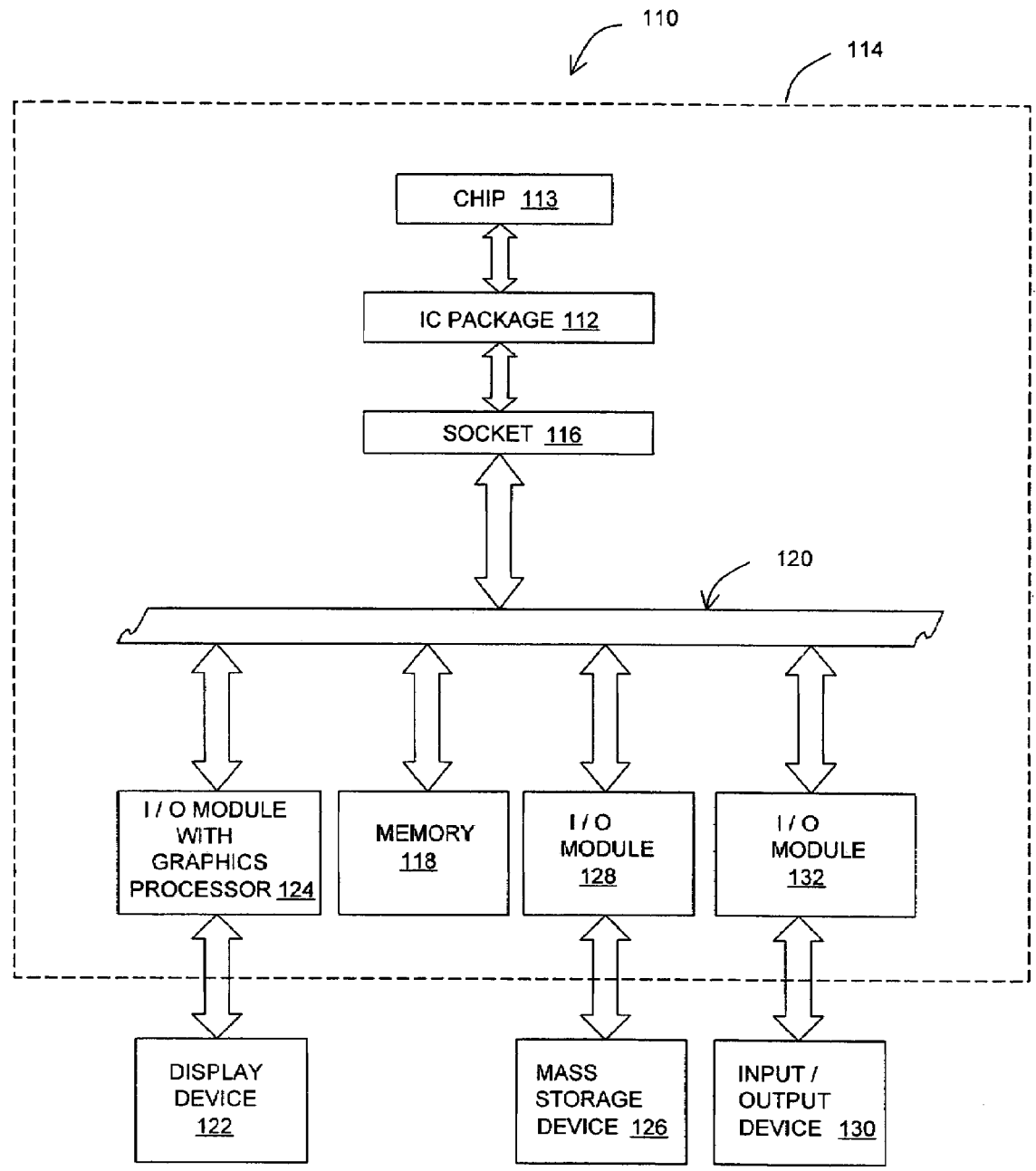
FIG. 13 is a system incorporating one or more of the system/scanout or system/scanout/scan cells according to the various embodiments of the present invention.

Referring to FIG. 13, there is illustrated a system 110, which is one of many possible systems in which an IC package 112 may be used. The IC package 112 includes an IC chip 113 having the system/scanout cells 30, 60, 70 and/or 90 of FIGS. 4, 6, 7, and 9, according to the various embodiments of the present invention, and/or the scanout/scan cell 100 of FIG. 10, according to another embodiment of the present invention. However, the various embodiments of the present invention are applicable to systems other than computer systems, and the computer system 110 is merely illustrative of one specific application. In the system 110, the IC package 112 is mounted on a substrate or printed circuit board (PCB) 114 via a socket 116. The IC chip 113 of the IC package 112 may be a processor and the PCB 114 may be a motherboard. In addition to the socket 116 and the IC package 112, the PCB 114 may have mounted thereon a main memory 118 and a plurality of input/output (I/O) modules for external devices or external buses, all coupled to each other by a bus system 120 on the PCB 114. More specifically, the system 110 may include a display device 122 coupled to the bus system 120 by way of an I/O module 124, with the I/O module 124 having a graphical processor and a memory. The I/O module 124 may be mounted on the PCB 114 or may be mounted on a separate expansion board. The system 110 may further include a mass storage device 126 coupled to the bus system 120 via an I/O module 128. Another I/O device 130 may be coupled to the bus system 120 via an I/O module 132. Additional I/O modules may be included for other external or peripheral devices or external buses. Examples of the main memory 118 include, but are not limited to, static random access memory (SRAM) and dynamic random access memory (DRAM). Examples of the mass storage device 126 include, but are not limited to, a hard disk drive, a compact disk drive (CD), a digital versatile disk driver (DVD), a floppy diskette, a tape system and so forth.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is manifestly intended that this invention be limited only by the claims and the equivalents thereof.

What is claimed is:

1. An apparatus, comprising:
   a bistable system circuit adapted to generate a first output signal in response to a data input signal and a system clock signal during a self-checking mode of operation;
   a bistable scanout circuit adapted to generate a second output signal in response to the data input signal and the system clock signal during the self-checking mode of operation; and
   an error detecting circuit, coupled to the system circuit and the scanout circuit, to generate an error signal in response to a relative condition between the first output signal and the second output signal.

2. The apparatus according to claim 1, wherein the system circuit includes at least one system latch; and the scanout circuit includes at least one scanout latch.

3. The apparatus according to claim 2, wherein the system circuit further includes a first output terminal to output the first output signal; the scanout circuit further includes a second output terminal to output the second output signal; the error detecting circuit is adapted to be selectable in coupling together the first and the second output terminals during the self-checking mode of operation; and the scanout circuit is adapted to be disabled during a non-protect mode of operation.

4. The apparatus according to claim 2, wherein the system circuit further includes a first output terminal to output the first output signal; the scanout circuit further includes a second output terminal to output the second output signal; the error detecting circuit is adapted to be selectable in coupling together the first and the second output terminals during the self-checking mode of operation or uncoupling the first and the second output terminals from each other during a snapshot mode of operation.

5. The apparatus according to claim 2, further comprising:
   a system clock source adapted to generate the system clock signal; and
   a data source adapted to generate the data input signal; and
   wherein the system circuit further includes a first system data input terminal and a first system clock input terminal; the scanout circuit further includes a first scanout data input terminal and a first scanout clock input terminal; the first system data input terminal and the first scanout data input terminal are commonly coupled to the data source to receive the data input signal; and the first system clock input terminal and the first scanout clock input terminal are commonly coupled to the system clock source to receive the system clock signal.

6. The apparatus according to claim 5, wherein the scanout circuit further includes a second scanout data input terminal coupled to a shifted data input signal and a second scanout clock input terminal; the scanout circuit further includes a clock switching circuit having a switch input terminal coupled to the system clock source, a first switch output terminal coupled to the first scanout clock input terminal to provide the system clock to latch the data input signal, and a second switch output terminal coupled to the second scanout clock input terminal to provide the system clock to latch the shifted data input signal; and the clock switching circuit is adapted to be responsive to an enable signal to select the first switch output terminal in the self-checking mode of operation or the second switch output terminal in a scanout mode of operation.

7. The apparatus according to claim 6, wherein the system circuit further includes a first output terminal to output the first output signal; the scanout circuit further includes a second output terminal to output the second output signal; the scanout circuit further includes an Exclusive OR gate having a first gate input terminal coupled to the first output terminal, a second gate input terminal coupled to the second output terminal, and a gate output terminal to output a shifted data output signal.

8. The apparatus according to claim 7, wherein
   the scanout circuit further includes a third scanout data input terminal coupled to a scan-in signal and a third scanout clock input terminal coupled to a scan clock signal;

the apparatus further comprises a clock control circuit electrically interposed between the system clock source and the clock switching circuit and responsive to a capture signal to couple or decouple the system clock signal from the clock switching circuit; and the scanout circuit is further adapted to receive the scan-in signal and the scan clock signal when the clock control circuit decouples the system clock from the clock switching circuit.

9. The apparatus according to claim 1, wherein the system circuit includes a system flip-flop having a master system latch and a slave system latch coupled to the master system latch; and the scanout circuit includes a scanout flip-flop having a master scanout latch and a slave scanout latch coupled to the master scanout latch.

10. The apparatus according to claim 9, further comprising:

an error trapping circuit, having an input terminal coupled to an output terminal of the error detecting circuit, and an output terminal coupled to an input terminal of the scanout circuit, to provide the error signal to the scanout circuit to be stored in the scanout circuit.

11. The apparatus according to claim 9, further comprising:

an error trapping circuit including a logic gate; the logic gate including a first input terminal coupled to an output terminal of the error detecting circuit, a second input terminal coupled to the data input signal, and an output terminal coupled to the scanout circuit; and the logic gate being adapted to complement the data input signal provided to the scanout circuit in response to the error signal.

12. The apparatus according to claim 2, wherein the error detecting circuit is an Exclusive OR gate.

13. The apparatus according to claim 12, wherein the system circuit further includes a system flip-flop having a master system latch and a slave system latch coupled to the master system latch; and the scanout circuit further includes a scanout flip-flop having a master scanout latch and a slave scanout latch coupled to the master scanout latch, a first AND gate having a pair of input terminals coupled to the slave scanout latch and a shift signal, respectively, and an output terminal coupled to a first input terminal of the Exclusive OR gate, and a second AND gate having a pair of input terminals coupled to the slave system latch and a load signal, respectively, and an output terminal coupled to a second input terminal of the Exclusive OR gate.

14. An apparatus, comprising:

a bistable system circuit to generate a first output signal in response to a data input signal and a system clock signal during a blocking mode of operation;

a bistable scanout circuit to generate a second output signal in response the data input signal and the system clock signal during the blocking mode of operation; and an output joining circuit, coupled to the system circuit and the scanout circuit, to generate a system data output signal in response to the first and the second output signals.

15. The apparatus according to claim 14, wherein the system circuit includes at least one system latch and the scanout circuit includes at least one scanout latch.

16. The apparatus according to claim 15, wherein the output joining circuit includes at least one transmission gate.

17. The apparatus according to claim 15, wherein the output joining circuit includes a C-element.

18. The apparatus according to claim 17, wherein the C-element has an output node on which the system data output signal is generated; and the output joining circuit further includes a weak keeper circuit coupled to the output node.

19. The apparatus according to claim 15, wherein the system circuit further includes a first output terminal to output the first output signal; the scanout circuit further includes a second output terminal to output the second output signal; the output joining circuit is adapted to be selectable in coupling together the first and the second output terminals during the blocking mode of operation; and the scanout circuit is adapted to be disabled during a non-protect mode of operation.

20. The apparatus according to claim 15, wherein the system circuit further includes a first output terminal to output the first output signal; the scanout circuit further includes a second output terminal to output the second output signal; the output joining circuit is adapted to be selectable in coupling together the first and the second output terminals during the blocking mode of operation or uncoupling the first and the second output terminals from each other during a scanout mode of operation.

21. The apparatus according to claim 15, further comprising:

a system clock source adapted to generate the system clock signal; and a data source adapted to generate the data input signal; and wherein the system circuit further includes a first system data input terminal and a first system clock input terminal; the scanout circuit further includes a first scanout data input terminal and a first scanout clock input terminal; the first system data input terminal and the first scanout data input terminal are commonly coupled to the data source to receive the data input signal; and the first system clock input terminal and the first scanout clock input terminal are commonly coupled to the system clock source to receive the system clock signal.

22. The apparatus according to claim 21, wherein the scanout circuit further includes a second scanout data input terminal coupled to a shifted data input signal and a second scanout clock input terminal; the scanout circuit further includes a clock switching circuit having a switch input terminal coupled to the system clock source, a first switch output terminal coupled to the first scanout clock input terminal to provide the system clock to latch the data input signal, and a second switch output terminal coupled to the second scanout clock input terminal to provide the system clock to latch the shifted data input signal; and the clock switching circuit is adapted to be responsive to an enable signal to select the first switch output terminal in the blocking mode of operation or the second switch output terminal in a scanout mode of operation.

23. The apparatus according to claim 22, wherein the system circuit further includes a first output terminal to output the first output signal;

the scanout circuit further includes a second output terminal to output the second output signal, and an Exclusive OR gate having a first input terminal coupled to the first output terminal, a second input terminal coupled to the second output terminal, and an output terminal to output a shifted data output signal.

24. The apparatus according to claim 23, wherein the scanout circuit further includes a third scanout data input terminal coupled to a scan-in signal and a third scanout clock input terminal coupled to a scan clock signal;

the apparatus further comprises a clock control circuit electrically interposed between the system clock source and the clock switching circuit, and responsive to a capture signal to couple or decouple the system clock signal from the clock switching circuit; and the scanout circuit is further adapted to receive the scan-in signal and the scan clock signal when the clock control circuit decouples the system clock from the clock switching circuit.

25. The apparatus according to claim 14, wherein the system circuit includes a system flip-flop having a master system latch and a slave system latch coupled to the master system latch; and the scanout circuit includes a scanout flip-flop having a master scanout latch and a slave scanout latch coupled to the master scanout latch.

26. The apparatus according to claim 14, wherein the system circuit further includes a system flip-flop having a master system latch and a slave system latch coupled to the master system latch; and the scanout circuit further includes a scanout flip-flop having a master scanout latch and a slave scanout latch coupled to the master scanout latch;

an Exclusive OR gate having an output terminal to output a shifted data output signal;

a first AND gate having a pair of input terminals coupled to the slave scanout latch and a shift signal, respectively, and an output terminal coupled to a first input terminal of the Exclusive OR gate, and a second AND gate having a pair of input terminals coupled to the slave system latch and a load signal and an output terminal coupled to a second input terminal of the Exclusive OR gate.

27. A system, comprising:

an integrated circuit chip including a plurality of system/scanout cells and a system clock source to generate a system clock signal, each of the system/scanout cells including a bistable system circuit having a first output terminal and adapted to generate at the first output terminal a first output signal in response to a data input signal and the system clock signal during a blocking mode of operation, a bistable scanout circuit having a second output terminal and adapted to generate at the second output terminal a second output signal in response the data input signal and the system clock signal during the blocking mode of operation, and an output joining circuit coupled to the first output terminal and the second output terminal to generate a system data output signal;

a bus with the integrated circuit chip coupled thereto; and a mass storage device coupled to the bus.

28. The system according to claim 27, wherein the system circuit further includes at least one system latch and the scanout circuit further includes at least one scanout latch.

29. The system according to claim 27, wherein the output joining circuit includes at least one transmission gate.

30. The system according to claim 27, wherein the output joining circuit includes a C-element.

* * * * *